(12) United States Patent
Fukaya et al.

(10) Patent No.: US 12,641,723 B2
(45) Date of Patent: May 26, 2026

(54) FLEXIBLE PRINTED CIRCUIT BOARD AND METHOD OF MANUFACTURING FLEXIBLE PRINTED CIRCUIT BOARD

(71) Applicants:SUMITOMO ELECTRIC INDUSTRIES, LTD., Osaka (JP); SUMITOMO ELECTRIC PRINTED CIRCUITS, INC., Shiga (JP)

(72) Inventors: Yosuke Fukaya, Osaka (JP); Koji Nitta, Osaka (JP); Daisuke Sato, Shiga (JP)

(73) Assignees: Sumitomo Electric Industries, Ltd., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 133 days.

(21) Appl. No.: 18/278,281

(22) PCT Filed: May 27, 2022

(86) PCT No.: PCT/JP2022/021763
§ 371 (c)(1),
(2) Date: Aug. 22, 2023

(87) PCT Pub. No.: WO2023/276510
PCT Pub. Date: Jan. 5, 2023

(65) Prior Publication Data
US 2024/0121898 A1 Apr. 11, 2024

(30) Foreign Application Priority Data
Jul. 2, 2021 (JP) ................................. 2021-110599

(51) Int. Cl.
H05K 1/11 (2006.01)
H05K 1/03 (2006.01)
(Continued)

(52) U.S. Cl.
CPC ........... *H05K 1/118* (2013.01); *H05K 1/0393* (2013.01); *H05K 3/1258* (2013.01); *H05K 3/423* (2013.01); *H05K 3/0017* (2013.01)

(58) Field of Classification Search
CPC .......... H05K 1/11; H05K 1/111; H05K 1/118; H05K 1/0393; H05K 3/1258; H05K 3/423;
(Continued)

(56) References Cited

U.S. PATENT DOCUMENTS

2009/0266587 A1* 10/2009 Park ....................... H05K 3/107
174/254
2016/0066423 A1* 3/2016 Sakamoto ................ H05K 1/02
174/261

FOREIGN PATENT DOCUMENTS

| | | |
|---|---|---|
| JP | 2014-75163 | 4/2014 |
| JP | 2016-009854 A | 1/2016 |
| JP | 2018-116973 A | 7/2018 |

* cited by examiner

*Primary Examiner* — Roshn K Varghese
(74) *Attorney, Agent, or Firm* — Renner, Otto, Boisselle & Sklar, LLP

(57) ABSTRACT

A flexible printed circuit board according to an embodiment includes a base film and a first wire. The base film has a first surface. The first wire is disposed on the first surface. The first wire has a first layer and a second layer. The first layer is disposed on the first surface directly or indirectly. The second layer covers the first layer. In the first surface, a first groove is formed next to the first layer in a plan view. The second layer on a side surface of the first layer exists on a bottom surface and a side surface of the first groove.

8 Claims, 11 Drawing Sheets

(51) Int. Cl.
    *H05K 3/12*      (2006.01)
    *H05K 3/42*      (2006.01)
    *H05K 3/00*      (2006.01)

(58) Field of Classification Search
    CPC ...... H05K 3/0017; H05K 3/244; H05K 3/108;
                          H05K 3/107; H05K 3/24; H05K
                  2201/0154; H05K 2201/0344; H05K
              2201/09036; H05K 2203/0723; H05K
              2203/1572; H05K 2201/0338; H05K
              2201/0723; H05K 2201/0191; H05K
                2201/098; H05K 2201/1031; H05K
           2201/10318; H05K 2201/10242; H05K
           2201/09445; H05K 2201/0367; H05K
           2201/0989; H05K 2203/1476; H05K
                      3/3452; H01L 2224/11462
    See application file for complete search history.

FIG. 9

FLEXIBLE PRINTED CIRCUIT BOARD AND METHOD OF MANUFACTURING FLEXIBLE PRINTED CIRCUIT BOARD

TECHNICAL FIELD

The present disclosure relates to a flexible printed circuit board and a method of manufacturing the flexible printed circuit board. This application claims priority based on Japanese Patent Application No. 2021-110599 filed on Jul. 2, 2021. The entire contents described in the Japanese Patent Application are incorporated herein by reference.

BACKGROUND

A flexible printed circuit board described in Japanese Unexamined Patent Application Publication No. 2016-009854 (PTL 1) includes a base film and a wire disposed on a surface of the base film. The wire includes a first layer disposed on a surface of the base film and a second layer covering the first layer.

PRIOR ART DOCUMENT

Patent Literature

PTL 1: Japanese Unexamined Patent Application Publication No. 2016-009854

SUMMARY

A flexible printed circuit board according to an embodiment of the present disclosure includes a base film having a first surface, and a first wire disposed on the first surface. The first wire has a first layer disposed on the first surface directly or indirectly and a second layer covering the first layer. In the first surface, a first groove is formed next to the first layer in a plan view. The second layer includes a surface in contact with a side surface of the first layer and a bottom surface and a side surface of the first groove.

BRIEF DESCRIPTION OF THE DRAWINGS

FIG. 5 is a cross-sectional view for explaining a resist-layer formation step S22a.

FIG. 9 is a cross-sectional view of a flexible printed circuit board 200.

DETAILED DESCRIPTION

Figure 1:
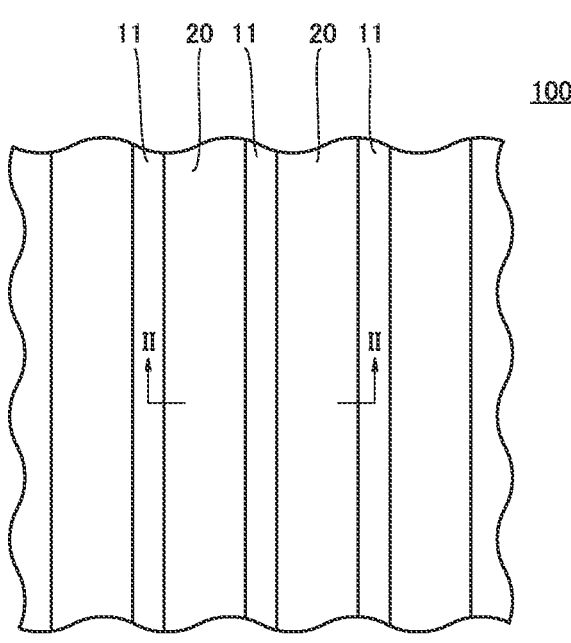
FIG. 1 is a plan view of a flexible printed circuit board 100.

Problems to be Solved by Present Disclosure

In the flexible printed circuit board described in PTL 1, since the wire is formed of the first layer and the second layer, the electric resistance value of the wire can be reduced as compared with the case where the wire is formed of only the first layer.

However, in the flexible printed circuit board disclosed in PTL 1, the height of the wire is large. Therefore, when the flexible printed circuit board described in PTL 1 is applied to an application in which the required thickness is small, a thin base film has to be used. When a thin base film is used for the flexible printed circuit board, the transportability of the flexible printed circuit board is reduced. Here, the transportability of the flexible printed circuit board means that the flexible printed circuit board is not easily wrinkled or folded during transportation.

The present disclosure has been made in view of the problems of the prior art as described above. More specifically, the present disclosure provides a flexible printed circuit board capable of achieving both reduction in resistance of a wire and maintenance of transportability.

Advantageous Effects of Present Disclosure

According to the flexible printed circuit board of the present disclosure, it is possible to reduce the resistance of the wire and to maintain the transportability.

DESCRIPTION OF EMBODIMENTS OF PRESENT DISCLOSURE

First, embodiments of the present disclosure will be listed and explained.

(1) A flexible printed circuit board according to an embodiment of the present disclosure includes a base film having a first surface, and a first wire disposed on the first surface. The first wire has a first layer disposed on the first surface directly or indirectly and a second layer covering the first layer. In the first surface, a first groove is formed next to the first layer in a plan view. The second layer includes a surface in contact with a side surface of the first layer and a bottom surface and a side surface of the first groove.

According to the flexible printed circuit board of the above (1), it is possible to achieve both reduction in resistance of the wire and maintenance of transportability.

(2) In the flexible printed circuit board according to (1), a value obtained by dividing a depth of the groove by a thickness of the base film may be 0.0005 or more.

(3) In the flexible printed circuit board according to (1) or (2), a thickness of the flexible printed circuit board may be 200 µm or less.

(4) In the flexible printed circuit board according to any one of (1) to (3), a material constituting the first layer and a material constituting the second layer may be identical to each other.

(5) In the flexible printed circuit board according to any one of (1) to (4), the first wire may further have a seed layer. The first layer may be disposed on the first surface with the seed layer interposed between the first layer and the first surface.

(6) The flexible printed circuit board according to (1) may further include a second wire. The base film may have a second surface opposite to the first surface. The second wire may be disposed on the second surface. The second wire may have a third layer disposed on the second surface, and a fourth layer covering the third layer. In the second surface, a second groove may be formed next to the third layer in the plan view. The fourth layer may include a surface in contact with a side surface of the third layer and a bottom surface and a side surface of the second groove.

(7) A method of manufacturing a flexible printed circuit board according to an embodiment of present disclosure includes preparing a base film having a first surface, and forming a wire on the first surface. Forming the wire includes forming a first layer on the first surface, forming a groove by using the first layer as a mask and etching the first surface next to the first layer in a plan view, and forming a second layer so as to cover the first layer. The second layer includes a surface in contact with a side surface of the first layer and a bottom surface and a side surface of the groove.

According to the method of manufacturing the flexible printed circuit board of the above (7), it is possible to obtain a flexible printed circuit board in which reduction in resistance of the wire and maintenance of transportability are both achieved.

(8) In the method of manufacturing the flexible printed circuit board according to (7), forming the first layer may include forming a seed layer on the first surface, forming a resist layer on the seed layer, patterning the resist layer, plating, with the first layer, the seed layer exposed from the patterned resist layer, and removing the patterned resist layer and the seed layer below the patterned resist layer.

Details of Embodiments of Present Disclosure

The details of embodiments of the present disclosure will now be described with reference to the drawings. In the following drawings, identical or corresponding parts are denoted by identical reference numerals, and redundant description will not be repeated.
(Configuration of Flexible Printed Circuit Board According to Embodiment)

Hereinafter, a configuration of a flexible printed circuit board (referred to as "flexible printed circuit board 100") according to an embodiment will be described.

Figure 2:
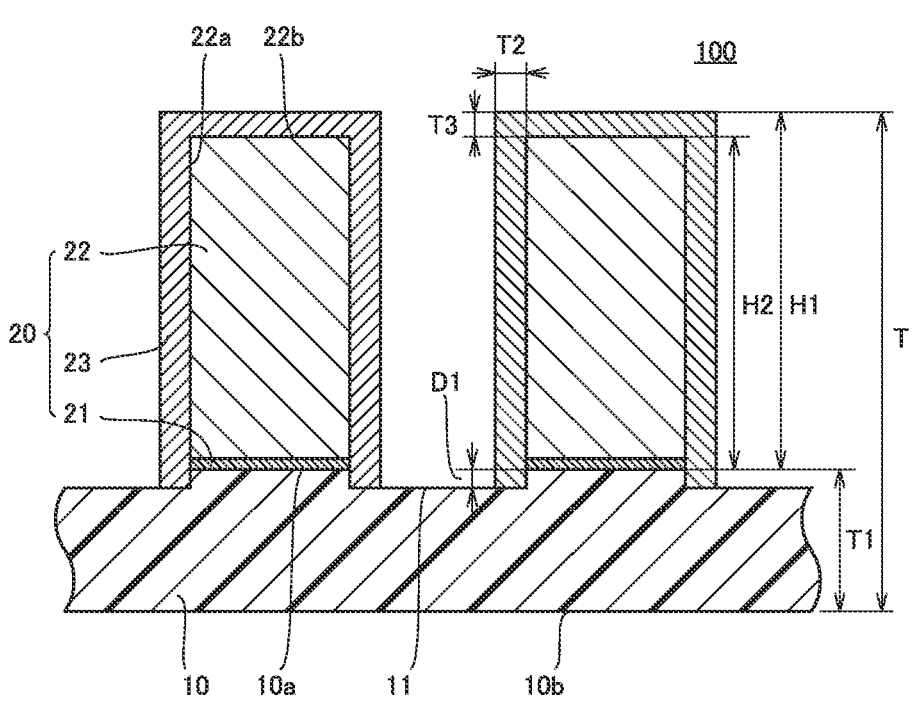
FIG. 2 is a cross-sectional view taken along line II-II of FIG. 1.

FIG. 1 is a plan view of a flexible printed circuit board 100. FIG. 2 is a cross-sectional view taken along line II-II of FIG. 1. As shown in FIGS. 1 and 2, flexible printed circuit board 100 includes a base film 10 and wires 20. The thickness of flexible printed circuit board 100 is referred to as a thickness T. Thickness T is a sum of a height H1 and a thickness T1 which will be described later. Thickness T is, for example, 30 μm to 200 μm. Thickness T is preferably 45 μm to 160 μm.

Base film 10 is formed of an electrically insulating and flexible resin material. Specific examples of the material constituting base film 10 include polyimide, polyethylene terephthalate, and fluororesin. Base film 10 has a first surface 10a and a second surface 10b. First surface 10a and second surface 10b are end surfaces of base film 10 in the thickness direction.

The thickness of base film 10 is defined as thickness T1. Thickness T1 is a distance between first surface 10a and second surface 10b. Thickness T1 is measured at a portion of first surface 10a where a groove 11 described later is not formed. Thickness T1 is, for example, 5 μm to 100 μm. Thickness T1 is preferably 45 μm to 80 μm. Thickness T1 is preferably 75 μm or less.

Wire 20 is disposed on first surface 10a. The height of wire 20 is defined as height H1. Height H1 is, for example, 25 μm to 100 μm. Height H1 is preferably 35 μm to 80 μm.

Height H1 is more preferably 40 μm to 75 μm. Wire 20 includes a seed layer 21, a first layer 22, and a second layer 23.

Seed layer 21 is disposed on first surface 10a. Seed layer 21 is formed of, for example, a nickel (Ni)-chromium (Cr) alloy. Seed layer 21 is, for example, a sputtered layer (a layer formed by sputtering). Seed layer 21 may include a copper (Cu) layer formed by sputtering on the nickel-chromium alloy layer.

First layer 22 is disposed on first surface 10a with seed layer 21 interposed therebetween. First layer 22 is formed of, for example, copper. First layer 22 has a side surface 22a and an upper surface 22b. The sum of the height of seed layer 21 and the height of first layer 22 is set to a height H2. Height H2 is, for example, 24 μm to 80 μm Height H2 is preferably 33 μm to 70 μm. Height H2 is more preferably 36.5 μm to 65 μm. First layer 22 is, for example, an electrolytic plating layer (a layer formed by electrolytic plating).

Groove 11 is formed in first surface 10a. First surface 10a is recessed toward second surface 10b in groove 11. In the plan view, groove 11 extends along wire 20. Groove 11 is formed in first surface 10a next to seed layer 21 and first layer 22 in the plan view. Preferably, in the plan view, a pair of grooves 11 are formed so as to sandwich seed layer 21 and first layer 22. In a cross-sectional view, groove 11 has, for example, a rectangular shape. However, the cross-sectional shape of groove 11 is not limited thereto. In a cross-sectional view, an angle formed by the bottom surface of groove 11 and the side surface of groove 11 may be an obtuse angle or an acute angle. In a cross-sectional view, the bottom surface and the side surface of groove 11 may be formed by curved lines or straight lines.

The depth of groove 11 is defined as a depth D1. Depth D1 is a distance between a portion of first surface 10a where groove 11 is not formed and the bottom surface of groove 11. Depth D1 is, for example, 50 nm to 1 μm. Depth D1 is preferably 100 nm to 500 nm. More preferably, depth D1 is 150 nm to 400 nm. The value (D1/T1) obtained by dividing depth D1 by thickness T1 is, for example, 0.0005 or more. The value obtained by dividing depth D1 by thickness T1 is preferably 0.0013 or more. The value obtained by dividing depth D1 by thickness T1 is more preferably 0.0020 or more.

Second layer 23 covers seed layer 21 and first layer 22. Second layer 23 is formed of, for example, copper. That is, it is preferable that the material constituting first layer 22 and the material constituting second layer 23 are identical to each other. "The material constituting first layer 22 and the material constituting second layer 23 are identical to each other" includes the case where the main component of the material constituting first layer 22 (the material occupying 90°/% or more in mass ratio) and the main component of the material constituting second layer 23 are identical to each other. Second layer 23 is, for example, an electrolytic plating layer.

Second layer 23 includes a surface in contact with side surface 22a, the bottom surface and the side surface of groove 11. The thickness of second layer 23 on side surface 22a is referred to as a thickness T2, and the thickness of second layer 23 on upper surface 22b is referred to as a thickness T3. Preferably, thickness T2 is greater than thickness T3. Thickness T2 is 1.0 μm to 20 μm. Thickness T2 is preferably 2.0 m to 15 μm. Thickness T2 is more preferably 3.5 μm to 10 μm. Thickness T3 is, for example, 1 μm to 200 μm.

(Method of Manufacturing Flexible Printed Circuit Board According to Embodiment)

Hereinafter, a method of manufacturing flexible printed circuit board 100 will be described.

Figure 3:
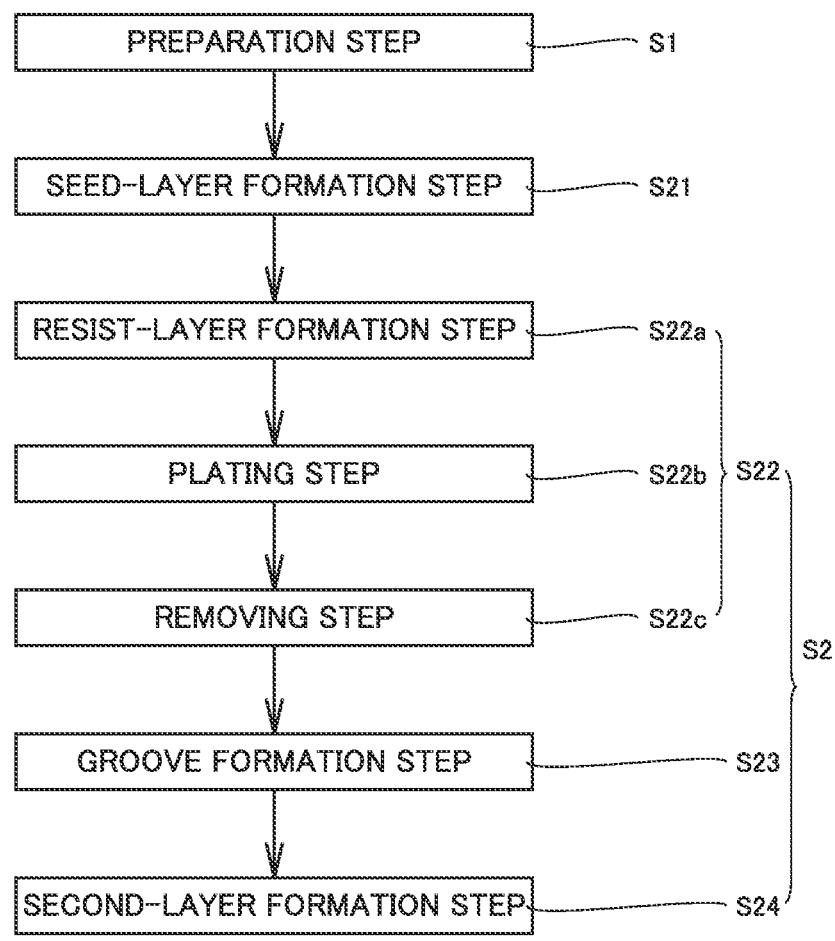
FIG. 3 is a step diagram of a method of manufacturing flexible printed circuit board 100.

FIG. 3 is a step diagram of a method of manufacturing flexible printed circuit board 100. As shown in FIG. 3, the method of manufacturing flexible printed circuit board 100 includes a preparation step S1 and a wire formation step S2. Wire formation step S2 is performed after preparation step S1. In preparation step S1, base film 10 is prepared. Wire formation step S2 includes a seed-layer formation step S21, a first-layer formation step S22, a groove formation step S23, and a second-layer formation step S24. First-layer formation step S22 is performed after seed-layer formation step S21. Groove formation step S23 is performed after first-layer formation step S22. Second-layer formation step S24 is performed after groove formation step S23.

Figure 4:
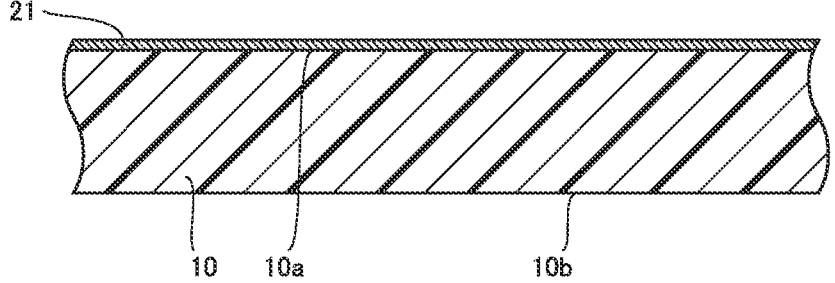
FIG. 4 is a cross-sectional view for explaining a seed-layer formation step S21.

FIG. 4 is a cross-sectional view for explaining seed-layer formation step S21. As shown in FIG. 4, in seed-layer formation step S21, seed layer 21 is formed. Seed layer 21 is formed by depositing a material constituting seed layer 21 on first surface 10a. This film formation is performed by, for example, sputtering.

In first-layer formation step S22, first layer 22 is formed. More specifically, first-layer formation step S22 includes a resist-layer formation step S22a, a plating step S22b, and a removing step S22c. In other words, first-layer formation step S22 is performed by, for example, a semi-additive method. However, first-layer formation step S22 may be performed by a subtractive method. Plating step S22b is performed after resist-layer formation step S22a. Removing step S22c is performed after plating step S22b.

Figure 5:
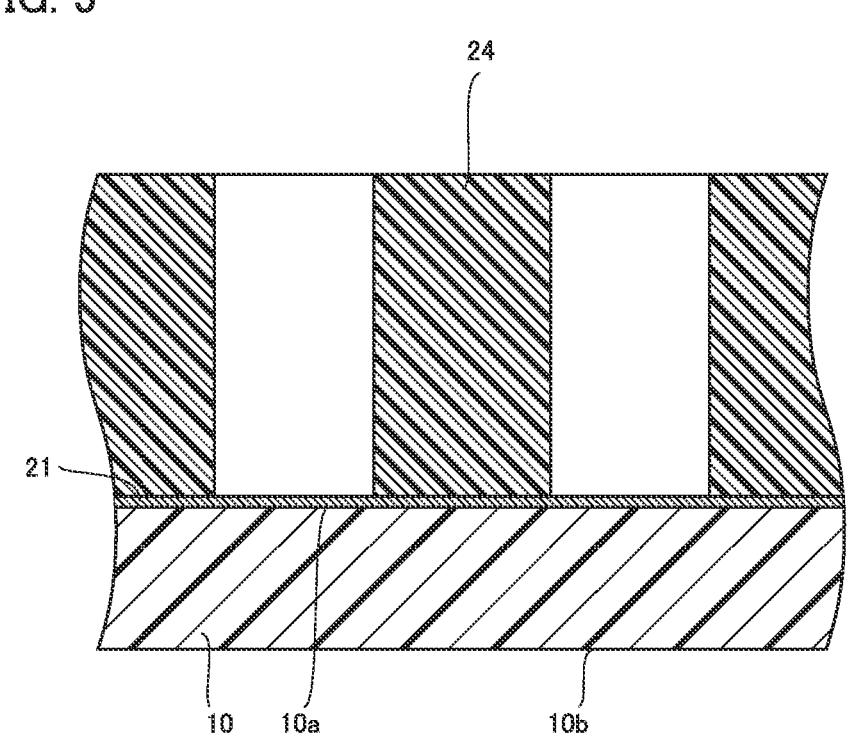

FIG. 5 is a cross-sectional view for explaining resist-layer formation step S22a. As shown in FIG. 5, in resist-layer formation step S22a, a resist layer 24 is formed. First, in the formation of resist layer 24, a photosensitive organic material constituting resist layer 24 is formed on seed layer 21. Second, the material constituting a formed resist layer 24 is patterned by exposing and developing the material constituting a formed resist layer 24. Thus, resist layer 24 is formed.

Figure 6:
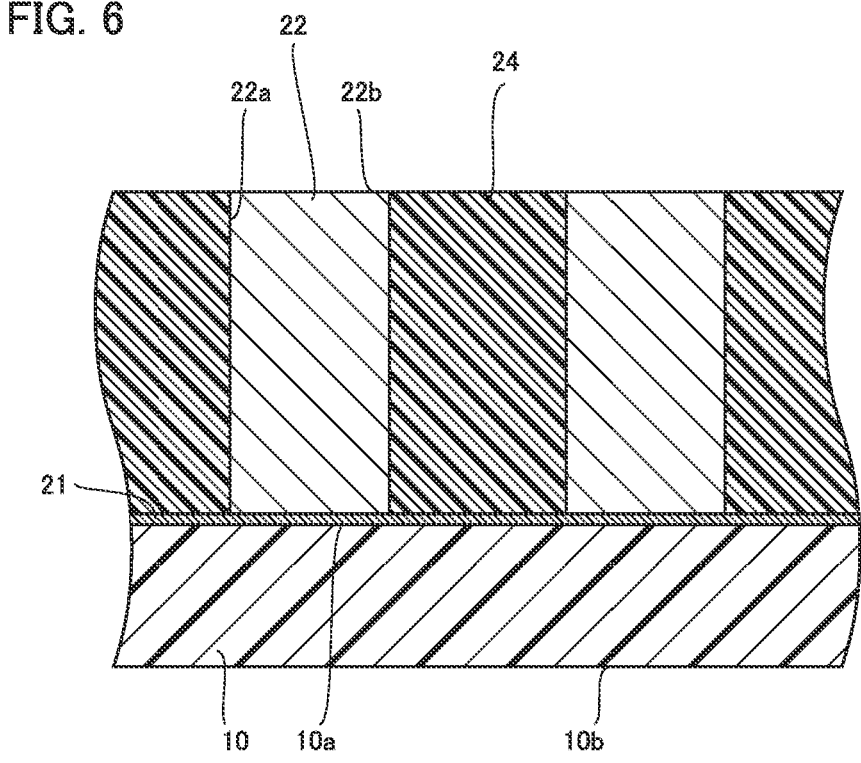
FIG. 6 is a cross-sectional view for explaining a plating step S22b.

FIG. 6 is a cross-sectional view for explaining plating step S22b. As shown in FIG. 6, in plating step S22b, first layer 22 is formed. First layer 22 is formed by, for example, electrolytic plating.

In plating step S22b, flexible printed circuit board 100 is immersed in a plating solution containing a material constituting first layer 22, and seed layer 21 is energized. As a result, the material constituting first layer 22 is electroplated on seed layer 21 exposed from resist layer 24 to form first layer 22.

Figure 7:
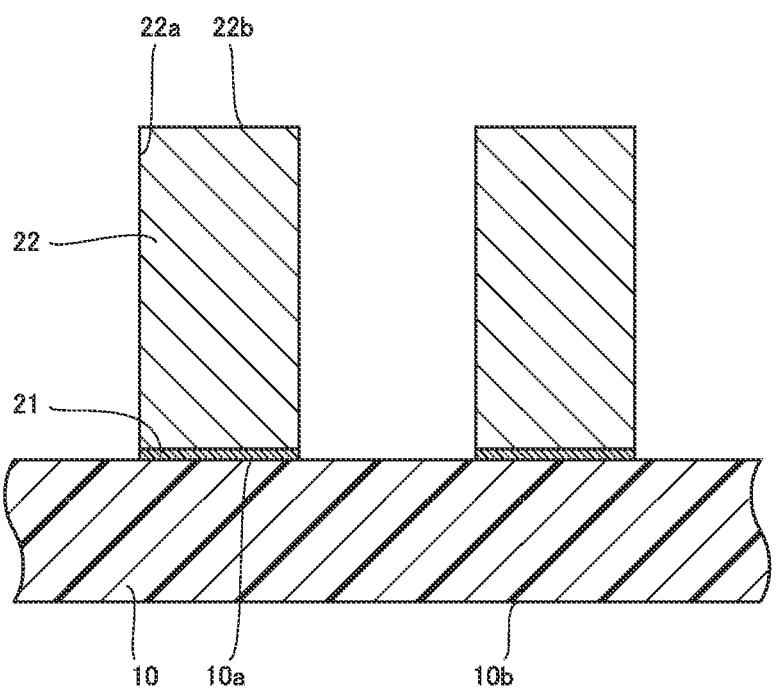
FIG. 7 is a cross-sectional view for explaining a removing step S22c.

FIG. 7 is a cross-sectional view for explaining removing step S22c. As shown in FIG. 7, in removing step S22c, resist layer 24 and seed layer 21 under resist layer 24 are removed. More specifically, after resist layer 24 is removed, seed layer 21 is removed by etching.

Figure 8:
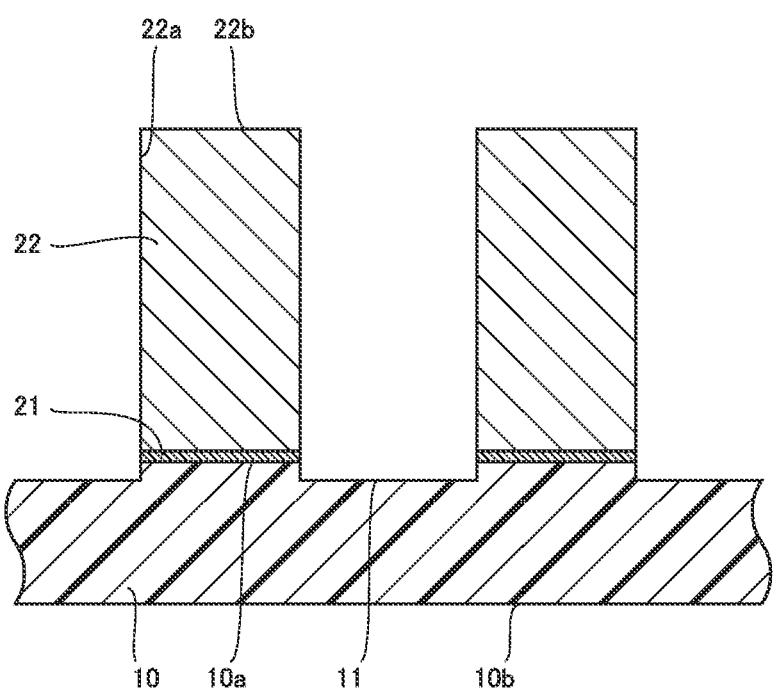
FIG. 8 is a cross-sectional view for explaining a groove formation step S23.

FIG. 8 is a cross-sectional view for explaining groove formation step S23. As shown in FIG. 8, in groove formation step S23, groove 11 is formed. Groove 11 is formed by etching first surface 10a using seed layer 21 and first layer 22 as a mask. The etching may be wet etching (wet desmear) or dry etching (dry desmear).

In second-layer formation step S24, second layer 23 is formed. Second layer 23 is formed by, for example, electrolytic plating. That is, flexible printed circuit board 100 is immersed in a plating solution containing a material constituting second layer 23, and seed layer 21 and first layer 22 are energized. As a result, the material constituting second layer 23 is electroplated so as to cover seed layer 21 and first layer 22, thereby forming second layer 23. As described above, flexible printed circuit board 100 having the structure shown in FIGS. 1 and 2 is formed.

(Effects of Flexible Printed Circuit Board According to Embodiment)

Hereinafter, effects of flexible printed circuit board 100 will be described in comparison with a flexible printed circuit board according to a comparative example (referred to as a "flexible printed circuit board 200").

Figure 9:
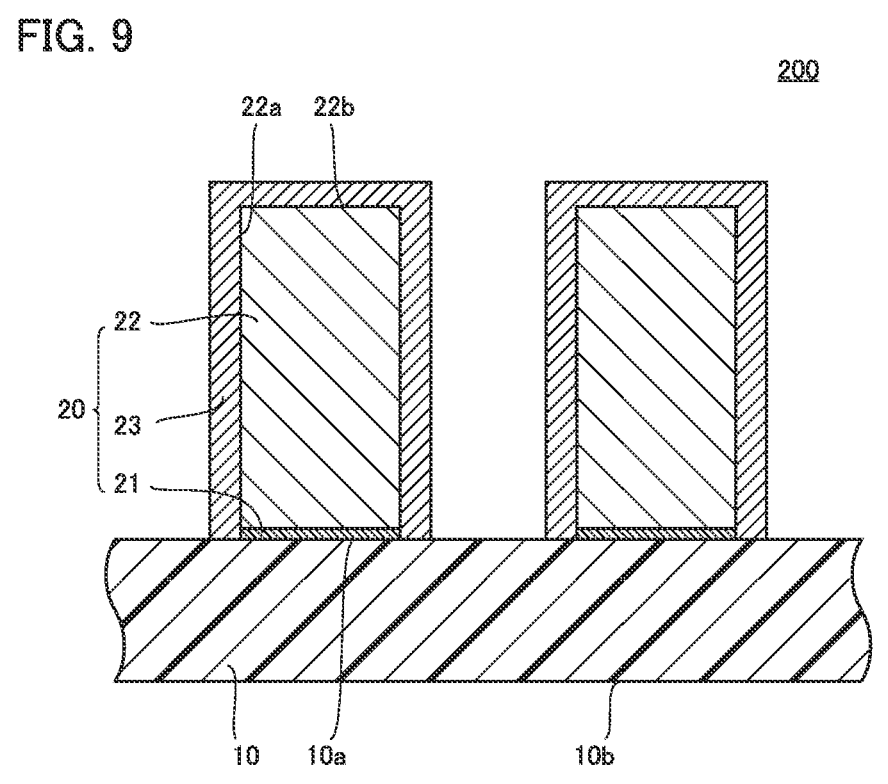

FIG. 9 is a cross-sectional view of a flexible printed circuit board 200. As shown in FIG. 9, flexible printed circuit board 200 has the same configuration as flexible printed circuit board 100 except that groove 11 is not formed in first surface 10a.

In flexible printed circuit board 100 and flexible printed circuit board 200, since wire 20 includes second layer 23 in addition to seed layer 21 and first layer 22, the cross-sectional area of wire 20 is increased, and the resistance of wire 20 is reduced as compared with the case where wire 20 includes only seed layer 21 and first layer 22.

In flexible printed circuit board 100, unlike flexible printed circuit board 200, since groove 11 is formed in first surface 10a, second layer 23 is formed to cover not only side surface 22a but also the side surface and the bottom surface of groove 11. Therefore, when second layer 23 of the same amount is formed, height H1 of flexible printed circuit board 100 is smaller than height H1 of flexible printed circuit board 200. From another point of view, in flexible printed circuit board 200, in order to reduce thickness T, thickness T1 has to be reduced, and the transportability is reduced.

In flexible printed circuit board 100, although the thickness of base film 10 is small in the portion where groove 11 is formed, the thickness of base film 10 is maintained in the portion where groove 11 is not formed, and thus the transportability is maintained. As described above, according to flexible printed circuit board 100, it is possible to reduce the resistance of wire 20 and to maintain the transportability.

EXAMPLES

The relationship between depth D1 and thickness T of flexible printed circuit board 100 and the transportability was evaluated. For this evaluation, samples 1 to 10 were provided as samples of flexible printed circuit board 100.

In the samples 1 to 10, the cross-sectional areas of wires 20, the width and thicknesses T2 of wires 20 were 1375 $\mu m^2$, 25 $\mu m$, and 4 $\mu m$, respectively. In the samples 1 to 10, thickness T1 was 0.1 mm. In samples 2 to 10, depth D1 was varied as shown in Table 1. In the samples 2 to 10, thickness T was measured. Thickness T was measured based on a cross-sectional image obtained by polishing a cross-section of each sample and then obtaining the cross-sectional image using a microscope. The transportability of each sample was evaluated by visually checking whether or not wrinkles or folds occurred. The evaluation of thickness T and the evaluation of the transportability were performed in four stages of A, B, C, and D. In the evaluation of thickness T and the evaluation of transportability, A is the highest and D is the lowest. The evaluation of thickness T becomes higher as thickness T becomes smaller, and the evaluation of the transportability becomes higher as there is occurrence of fewer wrinkles or folds.

TABLE 1

| | Sample 1 | Sample 2 | Sample 3 | Sample 4 | Sample 5 | Sample 6 | Sample 7 | Sample 8 | Sample 9 | Sample 10 |
|---|---|---|---|---|---|---|---|---|---|---|
| D1(mm) | 0.000000 | 0.000030 | 0.000050 | 0.000100 | 0.000150 | 0.000400 | 0.000500 | 0.001000 | 0.001500 | 0.002000 |
| T1(mm) | 0.1 | 0.1 | 0.1 | 0.1 | 0.1 | 0.1 | 0.1 | 0.1 | 0.1 | 0.1 |
| D1/T1 | 0 | 0.0003 | 0.0005 | 0.001 | 0.0015 | 0.004 | 0.005 | 0.01 | 0.015 | 0.02 |
| H1(μm) | 55.000 | 54.999 | 54.984 | 54.968 | 54.952 | 54.872 | 54.840 | 54.680 | 54.520 | 54.360 |
| T(mm) | 0.15500 | 0.15499 | 0.15498 | 0.15497 | 0.15495 | 0.15487 | 0.15484 | 0.15468 | 0.15452 | 0.15436 |
| Evaluation of T | D | C | B | B | B | B | B | B | B | B |
| transport-ability | D | C | A | A | A | A | A | A | A | B |

As shown in Table 1, in Sample 1 and Sample 2, the value obtained by dividing depth D1 by thickness T1 was less than 0.0005. As a result, in Sample 1 and Sample 2, thickness T was 0.15499 mm or more, and the evaluation of thickness T was C or lower. In Sample 1 and Sample 2, since a base film having large thickness T and small thickness T1 has to be used, the evaluation of the transportability was C or lower. However, since groove 11 was formed in the sample 2 while groove 11 was not formed in the sample 1, the evaluations of thickness T and the transportability of the sample 2 were higher than those of the sample 1.

In the samples 3 to 10, the value obtained by dividing depth D1 by thickness T1 was 0.0005 or more. As a result, in the samples 3 to 10, thickness T was 0.15498 mm or less, and the evaluation of thickness T was B or higher. In addition, in the samples 3 to 10, the evaluation of the transportability was B or higher.

From this comparison, it was experimentally found that the value obtained by dividing depth D1 by thickness T1 is particularly preferably 0.0005 or more from the viewpoint of improving the transportability of flexible printed circuit board 100.

(Modification 1)

Hereinafter, flexible printed circuit board 100 (referred to as "flexible printed circuit board 100A") according to modification 1 will be described. Here, points different from flexible printed circuit board 100 will be described, and redundant description will not be repeated.

Figure 10:
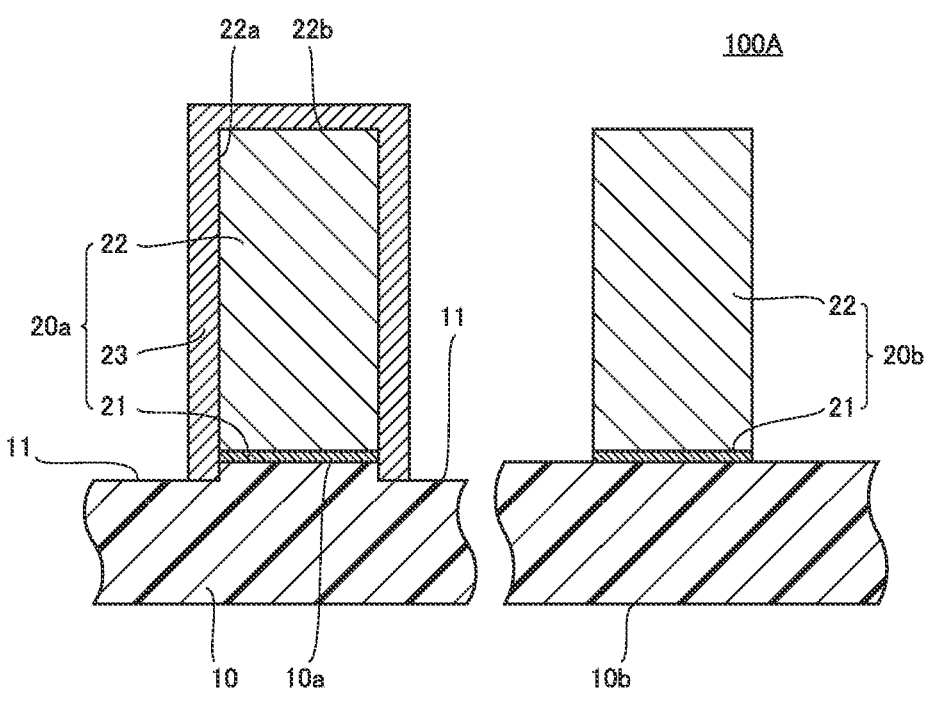
FIG. 10 is a cross-sectional view of a flexible printed circuit board 100A.

FIG. 10 is a cross-sectional view of a flexible printed circuit board 100A. As shown in FIG. 10, flexible printed circuit board 100A includes base film 10 and wire 20. In this regard, the configuration of flexible printed circuit board 100A is common to the configuration of flexible printed circuit board 100.

Wire 20 serving as the power line is referred to as a wire 20a. Wire 20 serving as the signal line is referred to as a wire 20b. In flexible printed circuit board 100A, wire 20 includes both wire 20a and wire 20b. In flexible printed circuit board 100A, wire 20a includes seed layer 21, first layer 22, and second layer 23, whereas wire 20b includes only seed layer 21 and first layer 22. That is, in flexible printed circuit board 100A, wire 20b does not have second layer 23.

In addition, in flexible printed circuit board 100A, groove 11 is formed in first surface 10a next to first layer 22 of wire 20a, whereas groove 11 is not formed in first surface 10a next to first layer 22 of wire 20b. In these respects, the configuration of flexible printed circuit board 100A is different from the configuration of flexible printed circuit board 100.

Wire 20 as the power line is required to have low resistance, whereas wire 20 as the signal line is not required to have low resistance in some cases. In flexible printed circuit board 100A, since wire 20a includes second layer 23, it is possible to cope with a reduction in resistance. In addition, in flexible printed circuit board 100A, since groove 11 is not formed in first surface 10a next to seed layer 21 and first layer 22 of wire 20b, the formation amount of groove 11 is reduced, and thus the transportability of flexible printed circuit board 100A may be further improved.

(Modification 2)

Hereinafter, flexible printed circuit board 100 (referred to as "flexible printed circuit board 100B") according to modification 2 will be described. Here, points different from flexible printed circuit board 100 will be described, and redundant description will not be repeated.

Figure 11:
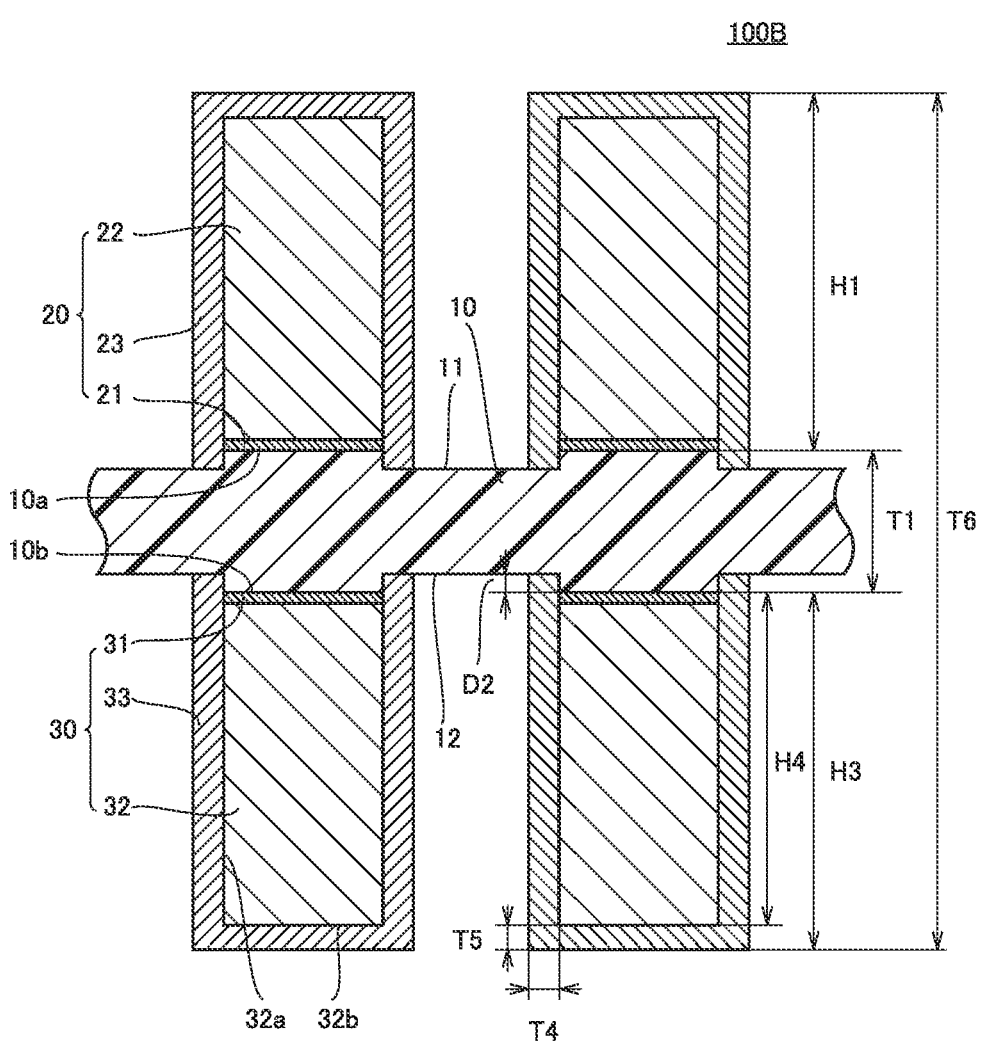
FIG. 11 is a cross-sectional view of a flexible printed circuit board 100B.

FIG. 11 is a cross-sectional view of a flexible printed circuit board 100B. As shown in FIG. 11, flexible printed circuit board 100B includes base film 10 and wire 20. In this regard, the configuration of the flexible printed circuit board 100B is common to the configuration of flexible printed circuit board 100.

Flexible printed circuit board 100B further includes a wire 30. In flexible printed circuit board 100B, a groove 12 is formed in base film 10. In these respects, the configuration of flexible printed circuit board 100B is different from the configuration of flexible printed circuit board 100.

Wire 30 is disposed on second surface 10b. The height of wire 30 is referred to as a height H3. Height H3 is, for example, 25 μm to 100 μm. Height H3 is preferably 35 μm to 80 μm. Height H3 is more preferably 40 μm to 75 μm. Height H3 is, for example, equal to height H2. Wire 30 includes a seed layer 31, a third layer 32, and a fourth layer 33.

Seed layer 31 is disposed on second surface 10b. Seed layer 31 is formed of, for example, a nickel-chromium alloy. Seed layer 31 is, for example, a sputtered layer. Seed layer 31 may include a copper layer formed by sputtering on the nickel-chromium alloy layer.

Third layer 32 is disposed on second surface 10b with seed layer 31 interposed therebetween. Third layer 32 is formed of, for example, copper. Third layer 32 has a side surface 32a and an upper surface 32b. The sum of the height of seed layer 31 and the height of third layer 32 is set to a height H4. Height H4 is, for example, 24 μm to 80 μm. Height H4 is preferably 33 μm to 70 μm. Height H4 is more preferably 36.5 μm to 65 μm. Third layer 32 is, for example, an electrolytic plating layer.

Groove 12 is formed in second surface 10b. Second surface 10b is recessed toward first surface 10a in groove 12. In the plan view, groove 12 extends along wire 30. Groove 12 is formed in second surface 10b next to seed layer 31 and third layer 32 in the plan view. Preferably, in the plan view, a pair of grooves 12 are formed so as to sandwich seed layer 31 and third layer 32. In the cross-sectional view, groove 12 has, for example, a rectangular shape. However, the cross-sectional shape of groove 12 is not limited thereto. In the cross-sectional view, an angle formed by the bottom surface of groove 12 and the side surface of groove 12 may be an obtuse angle or an acute angle. In the cross-sectional view, the bottom surface and the side surface of groove 12 may be formed by curved lines or straight lines.

The depth of groove 12 is defined as a depth D2. Depth D2 is a distance between a portion of second surface 10*b* where groove 12 is not formed and the bottom surface of groove 12. Depth D2 is, for example, 50 nm to 1 μm. Depth D2 is preferably 100 nm to 500 nm. Depth D2 is more preferably 150 nm to 400 nm. The value (D2/T1) obtained by dividing depth D2 by thickness T1 is, for example, 0.0005 or more. The value obtained by dividing depth D2 by thickness T1 is preferably 0.0013 or more. The value obtained by dividing depth D2 by thickness T1 is more preferably 0.0020 or more.

Fourth layer 33 covers seed layer 31 and third layer 32. Fourth layer 33 is formed of, for example, copper. That is, it is preferable that the material constituting third layer 32 and the material constituting fourth layer 33 are identical to each other. "The material constituting third layer 32 and the material constituting fourth layer 33 are identical to each other" includes the case where the main component of the material constituting third layer 32 (the material accounting for 90% or more in mass ratio) and the main component of the material constituting fourth layer 33 are identical to each other. Fourth layer 33 is, for example, an electrolytic plating layer.

Fourth layer 33 includes a surface in contact with side surface 32*a*, the bottom surface and the side surface of groove 12. The thickness of fourth layer 33 on side surface 32*a* is referred to as a thickness T4, and the thickness of fourth layer 33 on upper surface 32*b* is referred to as a thickness T5. Preferably, thickness T4 is greater than thickness T5. Thickness T4 is 1.0 μm to 20 μm. Thickness T4 is preferably 2.0 μm to 15 μm. Thickness T4 is more preferably 3.5 μm to 10 μm. Thickness T5 is, for example, 1 μm to 200 μm.

The thickness of the flexible printed circuit board 100B is referred to as a thickness T6. Thickness T6 is the sum of height H1, height H3, and thickness T1. Thickness T6 is, for example, 55 μm to 300 μm. Thickness T6 is preferably 80 μm to 240 μm. Thickness T6 is more preferably 93 μm to 225 μm.

It should be understood that the embodiments disclosed herein are illustrative in all respects and are not restrictive. The scope of the present invention is defined not by the above-described embodiments but by the claims, and is intended to include all modifications within the meaning and scope equivalent to the claims.

REFERENCE SIGNS LIST

10 base film, 10*a* first surface, 10*b* second surface, 11, 12 groove, 20, 20*a*, 20*b* wire, 21 seed layer, 22 first layer, 22*a* side surface, 22*b* upper surface, 23 second layer, 24 resist layer, 30 wire, 31 seed layer, 32 third layer, 32*a* side surface, 32*b* upper surface, 33 fourth layer, 100, 100A, 200 flexible printed circuit board, D1, D2 depth, H1, H2, H3, H4 height, S1 preparation step, S2 wire formation step, S21 seed-layer formation step, S22 first-layer formation step, S22*a* resist-layer formation step, S22*b* plating step, S22*c* removing step, S23 groove formation step, S24 second-layer formation step, T, T1, T2, T3, T4, T5, T6 thickness.

The invention claimed is:

1. A flexible printed circuit board comprising:
   a flexible base film comprising a flexible resin material having a first surface; and
   a first wire disposed on the first surface,
   wherein the first wire has a first layer disposed on the first surface directly or indirectly and a second layer covering the first layer,
   wherein in the first surface, a first groove is formed recessed into the first surface next to the first layer in a plan view,
   wherein the second layer includes a surface in contact with a side surface of the first layer and extends into the first groove, contacting a bottom surface and a side surface of the first groove, and
   wherein the bottom surface of the first groove, in side cross-sectional view, is lower than the entire bottom surface of the first layer.

2. The flexible printed circuit board according to claim 1, wherein a value obtained by dividing a depth of the first groove by a thickness of the base film is 0.0005 or more.

3. The flexible printed circuit board according to claim 1, wherein a thickness of the flexible printed circuit board is 200 or less.

4. The flexible printed circuit board according to claim 1, wherein a material constituting the first layer and a material constituting the second layer are identical to each other.

5. The flexible printed circuit board according to claim 1, wherein the first wire further has a seed layer, and
   wherein the first layer is disposed on the first surface with the seed layer interposed between the first layer and the first surface.

6. The flexible printed circuit board according to claim 1, further comprising:
   a second wire,
   wherein the base film has a second surface opposite to the first surface,
   wherein the second wire is disposed on the second surface,
   wherein the second wire has a third layer disposed on the second surface, and a fourth layer covering the third layer,
   wherein in the second surface, a second groove is formed next to the third layer in the plan view, and
   wherein the fourth layer includes a surface in contact with a side surface of the third layer and a bottom surface and a side surface of the second groove.

7. A method of manufacturing a flexible printed circuit board, the method comprising:
   preparing a flexible base film comprising a flexible resin material having a first surface; and
   forming a wire on the first surface,
   wherein forming the wire includes forming a first layer on the first surface, forming a groove recessed into the first surface by using the first layer as a mask and etching the first surface next to the first layer in a plan view, and forming a second layer so as to cover the first layer,
   wherein the second layer includes a surface in contact with a side surface of the first layer and extends into the first groove, contacting a bottom surface and a side surface of the groove, and
   wherein the bottom surface of the first groove, in side cross-sectional view, is lower than the entire bottom surface of the first layer.

8. The method of manufacturing the flexible printed circuit board according to claim 7,
   wherein forming the first layer includes
      forming a seed layer on the first surface,
      forming a resist layer on the seed layer, patterning the resist layer, plating, with the first layer, the seed layer exposed from the patterned resist layer, and removing the patterned resist layer and the seed layer below the patterned resist layer.

\* \* \* \* \*